(12) United States Patent
Yu

(10) Patent No.: US 12,074,183 B2
(45) Date of Patent: Aug. 27, 2024

(54) SEMICONDUCTOR PACKAGING METHOD AND SEMICONDUCTOR PACKAGE DEVICE

(71) Applicant: TONGFU MICROELECTRONICS CO., LTD., Nantong (CN)

(72) Inventor: Guoqing Yu, Nantong (CN)

(73) Assignee: TONGFU MICROELECTRONICS CO., LTD., Nantong (CN)

( * ) Notice: Subject to any disclaimer, the term of this patent is extended or adjusted under 35 U.S.C. 154(b) by 572 days.

(21) Appl. No.: 17/308,648

(22) Filed: May 5, 2021

(65) Prior Publication Data

US 2021/0343763 A1  Nov. 4, 2021

Related U.S. Application Data

(63) Continuation of application No. PCT/CN2019/082308, filed on Apr. 11, 2019.

(30) Foreign Application Priority Data

Nov. 12, 2018  (CN) .......................... 201811341281.1
Nov. 12, 2018  (CN) .......................... 201811341297.2
Nov. 12, 2018  (CN) .......................... 201811341984.4

(51) Int. Cl.
*H01L 27/146*  (2006.01)

(52) U.S. Cl.
CPC .... *H01L 27/1462* (2013.01); *H01L 27/14618* (2013.01); *H01L 27/14632* (2013.01);
(Continued)

(58) Field of Classification Search
None
See application file for complete search history.

(56) References Cited

U.S. PATENT DOCUMENTS 6,777,767 B2 *  8/2004  Badehi ................. B81B 7/0067
                                                                257/434
7,419,852 B2 *  9/2008  Benson ............ H01L 27/14625
                                                              257/E21.597
(Continued)

FOREIGN PATENT DOCUMENTS

CN        1875476 A     12/2006
CN      107039365 A      8/2017
(Continued)

OTHER PUBLICATIONS

World Intellectual Property Organization (WIPO) International Search Report for PCT/CN2019/082308 Aug. 15, 2019 6 Pages.

*Primary Examiner* — William C Trapanese
(74) *Attorney, Agent, or Firm* — Anova Law Group, PLLC

(57) ABSTRACT

The present disclosure provides a semiconductor packaging method and a semiconductor package device. The method includes providing a chip, where the chip includes a chip substrate having a front surface and a back surface; soldering pads; a metal part formed on a side of each soldering pad facing away from the chip substrate; and a transparent protective layer formed on the front surface of the chip substrate. The transparent protective layer covers a photosensitive region of the chip substrate and the metal part, and the transparent protective layer contains an opening at a position corresponding to the metal part to expose a first end of the metal part away from the soldering pads. The method further includes electrically connecting the first end of the metal part to a circuit board using a conductive connection part to electrically connect the chip with the circuit board.

20 Claims, 4 Drawing Sheets

(52) U.S. Cl.
CPC .. *H01L 27/14636* (2013.01); *H01L 27/14685* (2013.01); *H01L 27/14687* (2013.01)

(56) References Cited

U.S. PATENT DOCUMENTS

| | | | |
|---|---|---|---|
| 7,923,298 B2 * | 4/2011 | Oliver | H01L 27/14618 |
| | | | 438/114 |
| 7,939,361 B2 * | 5/2011 | Honda | H01L 24/97 |
| | | | 257/E31.127 |
| 8,053,868 B2 * | 11/2011 | Ryu | H01L 31/0203 |
| | | | 257/222 |
| 9,450,004 B2 * | 9/2016 | Tu | H01L 27/14685 |
| 9,666,730 B2 * | 5/2017 | Oganesian | H01L 31/02002 |
| 9,996,752 B2 * | 6/2018 | Pham | G06T 7/73 |
| 10,164,602 B2 * | 12/2018 | Park | H03H 9/1071 |
| 10,340,250 B2 * | 7/2019 | Chen | B81C 3/001 |
| 10,529,752 B2 * | 1/2020 | Ishiwata | H01L 27/14601 |
| 2008/0191333 A1 * | 8/2008 | Yang | H01L 27/14618 |
| | | | 257/E23.18 |
| 2013/0175650 A1 * | 7/2013 | Gleason | H01L 27/14621 |
| | | | 257/434 |

FOREIGN PATENT DOCUMENTS

| | | |
|---|---|---|
| CN | 109545806 A | 3/2019 |
| CN | 109545808 A | 3/2019 |
| JP | 2001196504 A | 7/2001 |

\* cited by examiner

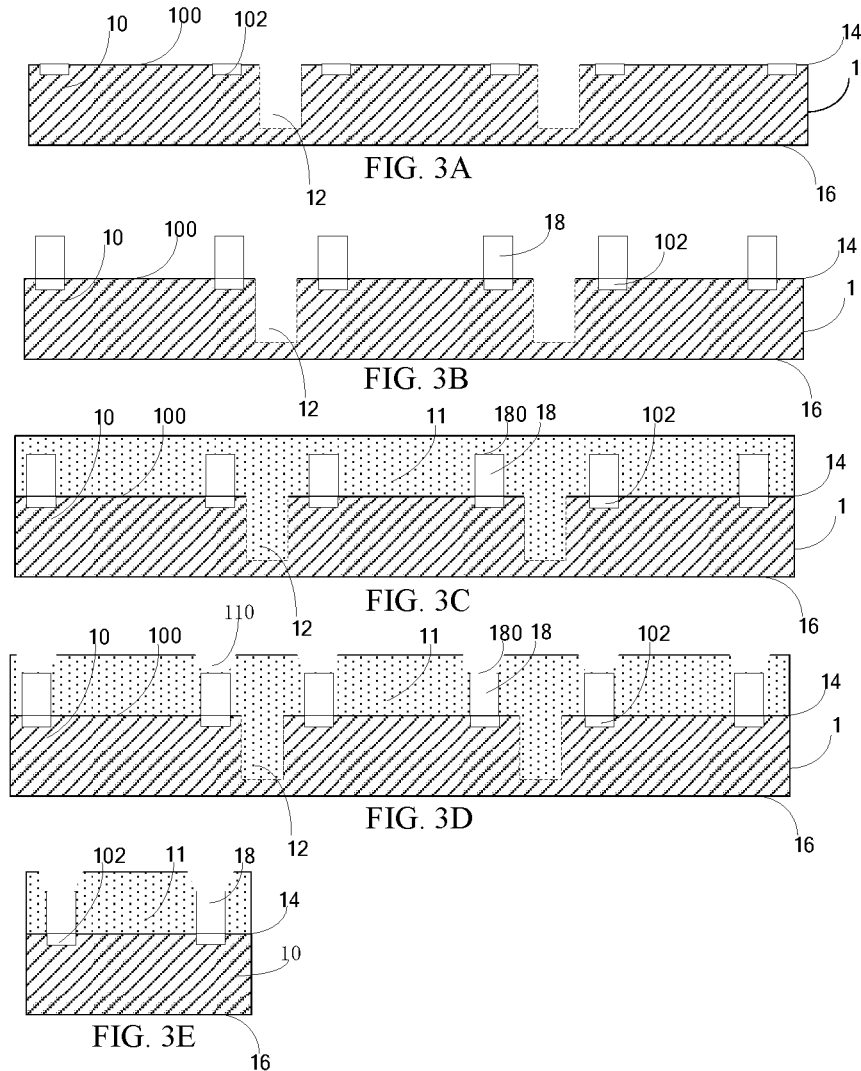
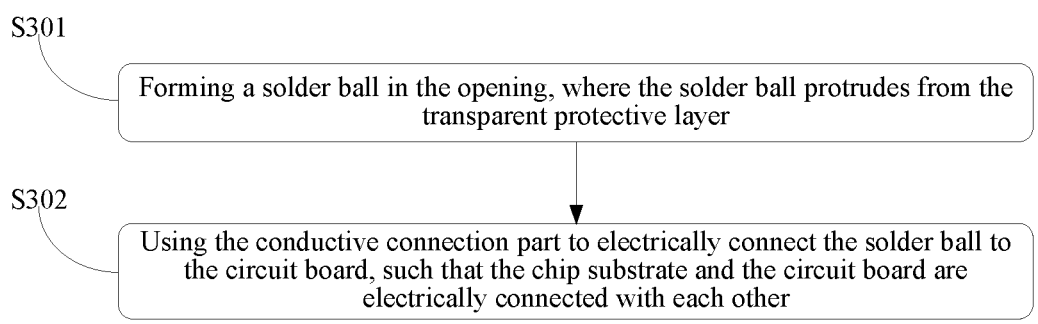

SEMICONDUCTOR PACKAGING METHOD AND SEMICONDUCTOR PACKAGE DEVICE

CROSS-REFERENCE TO RELATED APPLICATIONS

This application is a continuation application of PCT Patent Application No. PCT/CN2019/082308, filed on Apr. 11, 2019, which claims the priority of Chinese patent application No. 201811341281.1, filed on Nov. 12, 2018, No. 201811341297.2, filed on Nov. 12, 2018, and No. 201811341984.4, filed on Nov. 12, 2018, the entirety of all of which is incorporated herein by reference.

TECHNICAL FIELD

The present disclosure generally relates to the field of semiconductor technology and, more particularly, relates to a semiconductor packaging method and a semiconductor package device.

BACKGROUND

The chip with a photosensitive region is an extremely important part of camera equipment. In order to protect the photosensitive region of the chip, a commonly used packaging method may include adding a transparent glass cover above the photosensitive region of the chip, thereby protecting the photosensitive region of the chip.

The inventors of the present application has discovered that, on the one hand, since the thickness of the transparent glass cover is thick, refraction, reflection, energy loss and the like may occur when light passes through the transparent glass, which make the photosensitive effect of the chip not desirable; on the other hand, the transparent glass cover and the chip may be connected by an adhesive, the adhesive may be easy to be detached after a long period of use, and outside dust may easily enter the photosensitive region of the chip, thereby affecting the photosensitive effect of the chip.

SUMMARY

One aspect of the present disclosure includes a semiconductor packaging method. The method includes providing a chip, where the chip includes a chip substrate having a front surface and a back surface, where the front surface includes a photosensitive region; soldering pads disposed at the front surface of the chip substrate surrounding the photosensitive region; a metal part formed on a side of each soldering pad facing away from the chip substrate; and a transparent protective layer formed on the front surface of the chip substrate, where the transparent protective layer covers the photosensitive region of the chip substrate and the metal part, and the transparent protective layer contains an opening at a position corresponding to the metal part to expose a first end of the metal part away from the soldering pads; and the method further includes electrically connecting the first end of the metal part to a circuit board using a conductive connection part to electrically connect the chip with the circuit board.

Optionally, providing the chip includes providing a wafer, where the wafer includes a plurality of chip substrates arranged in a matrix and separated by dicing grooves between adjacent chip substrates, and the soldering pads are formed at the front surface of each chip substrate and surrounding a corresponding photosensitive region of each chip substrate; forming the metal part on each soldering pad facing away from the chip substrate; forming the transparent protective layer on the front surface of the chip substrate, where the transparent protective layer covers the photosensitive region and the metal part; forming the opening in the transparent protective layer at the position corresponding to the metal part, such that the first end of the metal part away from the soldering pads is exposed by the opening; and performing a cutting process along the dicing grooves of the wafer, thereby removing a portion of the wafer and a portion of the transparent protective layer that correspond to the dicing grooves to provide a plurality of single chips.

Optionally, forming the transparent protective layer on the front surface of the chip substrate includes forming the transparent protective layer on the front surface of the chip substrate by spin coating, dispensing or printing a material, and solidifying the material for the transparent protective layer.

Optionally, solidifying the material for the transparent protective layer includes solidifying the material for the transparent protective layer using ultraviolet irradiation or high-temperature baking.

Optionally, the transparent protective layer is made of the material including an inorganic transparent material and/or an organic transparent material, where the inorganic transparent material includes at least one of silicon nitride and silicon oxynitride; and the organic transparent material includes polysiloxane.

Optionally, electrically connecting the first end of the metal part to the circuit board using the conductive connection part to electrically connect the chip with the circuit board includes forming a solder ball in the opening; and using the conductive connection part to electrically connect the solder ball to the circuit board, such that the chip substrate and the circuit board are electrically connected with each other.

Optionally, electrically connecting the first end of the metal part to the circuit board using the conductive connection part includes using a wire to electrically connect the first end of the metal part to the circuit board.

Optionally, electrically connecting the first end of the metal part to the circuit board using the conductive connection part includes using a conductive folded plate to electrically connect the first end of the metal part to the circuit board.

Optionally, the conductive folded plate includes a first portion and a second portion, where the first portion is in parallel with the front surface of the chip substrate; the second portion is in parallel with a sidewall of the chip and disposed in a close proximity to the sidewall of the chip; the first portion is electrically connected to the first end of the metal part; and a side of the second portion facing toward the circuit board is electrically connected to the circuit board.

Optionally, the conductive folded plate includes a first portion, a second portion, and a third portion, where the first portion is connected to the third portion through the second portion; the first portion is in parallel with the front surface of the chip substrate; the second portion is in parallel with a sidewall of the chip and disposed in a close proximity to the sidewall of the chip; the third portion extends along a direction away from the chip; the third portion is in parallel with a surface of the circuit board; the first portion is electrically connected to the first end of the metal part; and a side of the third portion facing toward the circuit board is electrically connected to the circuit board.

Another aspect of the present disclosure includes a semiconductor package device. The package device includes a chip, where the chip includes a chip substrate having a front surface and a back surface, where the front surface includes a photosensitive region; soldering pads disposed at the front surface of the chip substrate surrounding the photosensitive region; a metal part formed on a side of each soldering pad facing away from the chip substrate; and a transparent protective layer formed on the front surface of the chip substrate, where the transparent protective layer covers the photosensitive region of the chip substrate and the metal part; and the transparent protective layer contains an opening at a position corresponding to the metal part to expose a first end of the metal part away from the soldering pads; a circuit board, on the back surface of the chip substrate; and a conductive connection part, which electrically connects a surface of the first end of the metal part, exposed by protruding over a surface of the transparent protective layer, to the circuit board, where the chip and the circuit board are electrically connected with each other.

Optionally, the transparent protective layer is formed by spin coating, dispensing, or printing a material.

Optionally, the transparent protective layer is a material after solidifying the material for the transparent protective layer using ultraviolet irradiation or high-temperature baking.

Optionally, the conductive connection part is a wire; and the metal part is a protruded metal column, or a protruded metal point.

Optionally, the conductive connection part is a conductive folded plate, and the conductive folded plate includes a first portion and a second portion, where the first portion is in parallel with the front surface of the chip substrate; the second portion is in parallel with a sidewall of the chip and disposed in a close proximity to the sidewall of the chip; the first portion is electrically connected to the first end of the metal part; and a side of the second portion facing toward the circuit board is electrically connected to the circuit board.

Optionally, the conductive connection part is a conductive folded plate, and the conductive folded plate includes a first portion, a second portion, and a third portion, where the first portion is connected to the third portion through the second portion; the first portion is in parallel with the front surface of the chip substrate; the second portion is in parallel with a sidewall of the chip and disposed in a close proximity to the sidewall of the chip; the third portion extends along a direction away from the chip; the third portion is in parallel with a surface of the circuit board; the first portion is electrically connected to the first end of the metal part; and a side of the third portion facing toward the circuit board is electrically connected to the circuit board.

Optionally, the conductive folded plate is made of an all-metal material; or the conductive folded plate includes a metal material and an insulation material surrounding the metal material.

Optionally, the conductive folded plate is made of an all-metal material; or the conductive folded plate includes a metal material and an insulation material surrounding the metal material.

Optionally, the metal part is a protruded metal column, or a protruded metal point.

Optionally, the device further includes a solder ball, where the solder ball is at the surface of the first end of the metal part, exposed by protruding over the surface of the transparent protective layer; and the solder ball is electrically connected to the conductive connection part.

Optionally, the device further includes an adhesive film, between the back surface of the chip substrate and the circuit board.

Other aspects of the present disclosure can be understood by those skilled in the art in light of the description, the claims, and the drawings of the present disclosure.

BRIEF DESCRIPTION OF THE DRAWINGS

In order to clearly explain the technical solutions in various embodiments of the present disclosure or the existing technology, the drawings that need to be used in the description of various embodiments or the existing technology are illustrated hereinafter. Obviously, the drawings in the following description are merely some embodiments of the present disclosure. For those skilled in the art, other drawings can be obtained based on such drawings without creative work.

FIGS. 3A-3E illustrate structural schematics of an exemplary package device corresponding to S201-S205 in FIG. 2 according to various embodiments of the present disclosure;

FIG. 4 illustrates a schematic flowchart of performing S102 in FIG. 1 according to various embodiments of the present disclosure;

DETAILED DESCRIPTION

The technical solutions in various embodiments of the present application may be clearly and completely described in conjunction with the drawings in various embodiments of the present application hereinafter. Obviously, the described embodiments may only be a part of various embodiments of the present application, rather than all of various embodiments. Based on various embodiments in the present application, all other embodiments obtained by those skilled in the art without creative work should fall within the protection scope of the present application.

The present disclosure provides a semiconductor packaging method and a semiconductor package device. The method includes providing a chip, where the chip includes a chip substrate having a front surface and a back surface; soldering pads; a metal part formed on a side of each soldering pad facing away from the chip substrate; and a transparent protective layer formed on the front surface of the chip substrate. The transparent protective layer covers a photosensitive region of the chip substrate and the metal part, and the transparent protective layer contains an opening at a position corresponding to the metal part to expose a first end of the metal part away from the soldering pads. The method further includes electrically connecting the first end of the metal part to a circuit board using a conductive connection part to electrically connect the chip with the circuit board.

Figure 1:
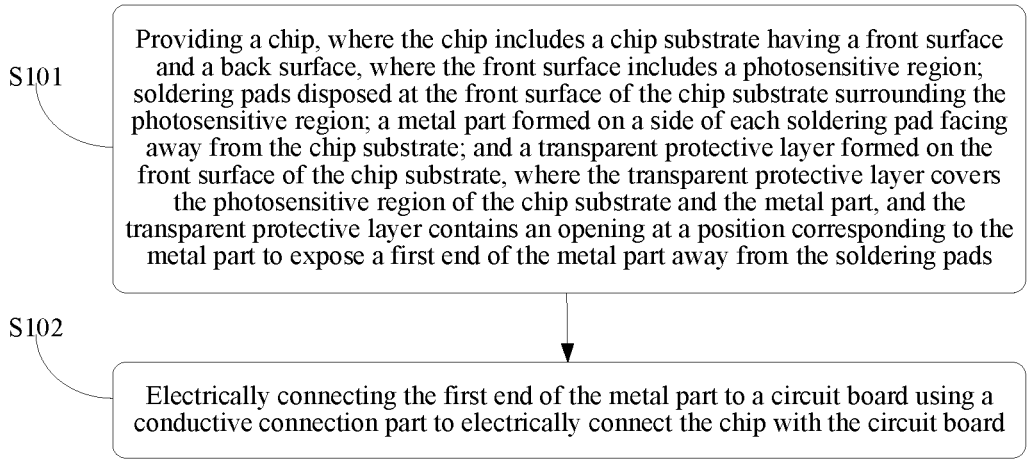
FIG. 1 illustrates a schematic flowchart of an exemplary packaging method according to various embodiments of the present disclosure.

Referring to FIG. 1, FIG. 1 illustrates a schematic flowchart of an exemplary packaging method according to various embodiments of the present disclosure. The packaging method may include the following exemplary steps.

In S101, a chip may be provided, where the chip may include a chip substrate having a front surface and a back surface, where the front surface includes a photosensitive region; soldering pads disposed at the front surface of the chip substrate surrounding the photosensitive region; a metal part formed on a side of each soldering pad facing away from the chip substrate; and a transparent protective layer formed on the front surface of the chip substrate. The transparent protective layer may cover the photosensitive region of the chip substrate and the metal part, and the transparent protective layer may contain an opening at a position corresponding to the metal part, such that the first end of the metal part away from the soldering pad may be exposed by the opening.

For example, the photosensitive region of the chip is an important part of the semiconductor package device; and if the photosensitive region is exposed, outside particles may easily pollute the photosensitive region and affect the imaging effect of the photosensitive region. Therefore, it is necessary to protect the photosensitive region of the chip.

Figure 2:
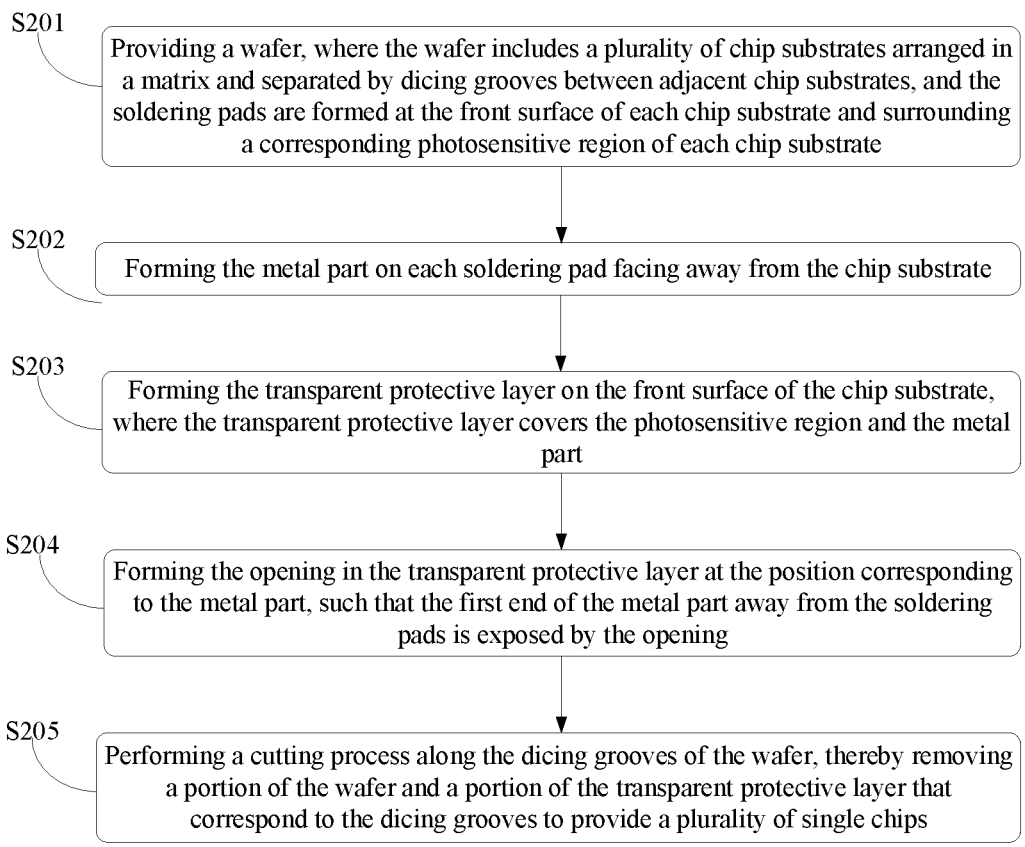
FIG. 2 illustrates a schematic flowchart of performing S101 in FIG. 1 according to various embodiments of the present disclosure.

In one embodiment, referring to FIGS. 2 and 3A-3D, FIG. 2 illustrates a schematic flowchart of performing S101 in FIG. 1 according to various embodiments of the present disclosure; and FIGS. 3A-3D illustrate structural schematics of an exemplary package device corresponding to S201-S205 in FIG. 2 according to various embodiments of the present disclosure. The above-mentioned S101 may include, for example, the following exemplary steps.

In S201, a wafer 1 may be provided, where the wafer 1 may include a plurality of chip substrates 10 arranged in a matrix; dicing grooves 12 may be disposed between the chip substrates 10; the wafer 1 may include a front surface 14 and a back surface 16; the front surface 14 of the chip substrate 10 may be the front surface 14 of the wafer 1, and the back surface 16 of the chip substrate 10 may be the back surface 16 of the wafer 1; the front surface 14 of the chip substrate 10 may include a photosensitive region 100 and be disposed with soldering pads 102 surrounding the photosensitive region 100; and the above-mentioned structure may be shown in FIG. 3A.

In S202, a metal part 18 may be formed on the side of each soldering pad 102 facing away from the chip substrate 10.

For example, referring to FIG. 3B, in an application case, the metal part 18 may be a protruded metal column. The above-mentioned S202 may include forming the protruded metal column on the side of the soldering pad 102 facing away from the chip substrate 10 using an electroplating process. The electroplating process may include partial electroplating, composite electroplating, pulse electroplating, electroforming, mechanical plating, and the like. The protruded metal column may be made of a conductive metal material including nickel, chromium, copper, zinc, cadmium, alloy, and/or any other suitable material(s), which may not be limited according to various embodiments of the present application.

In another application case, the metal part 18 may be a protruded metal point. The above-mentioned S202 may include forming the protruded metal point on the side of the soldering pad 102 facing away from the chip substrate 10 using a bonding process. The material of the protruded metal points may be gold, copper, and the like. The height of the protruded metal point formed by the bonding process may be less than the height of the protruded metal column formed by the electroplating process.

In S203, a transparent protective layer 11 may be formed on the front surface 14 of the chip substrate 10; and the transparent protective layer 11 may cover the photosensitive region 100 and the metal part 18.

For example, referring to FIG. 3C, in an application case, forming the transparent protective layer 11 may be forming the transparent protective layer 11 on the front surface 14 of the chip substrate 10 by spin coating, dispensing or printing a material, and solidifying the material of the transparent protective layer 11. The material of the transparent protective layer 11 may be an inorganic transparent material such as silicon nitride, silicon oxynitride and the like, or an organic transparent material such as polysiloxane. Furthermore, the manner for solidifying the transparent protective layer 11 may be ultraviolet irradiation or high-temperature baking. The used manner may be determined according to an initiator added to prepare the transparent protective layer 11. If the initiator is a photo-initiator (e.g., 2-hydroxy-2-methyl-1-phenylacetone, 1-hydroxycyclohexylphenyl ketone, and the like), an ultraviolet radiation manner may be used; and if the initiator is a thermal initiator (e.g., benzoyl peroxide, and the like), a high-temperature baking manner may be used. The thickness of the formed transparent protective layer 11 may be at the micron level.

The height between the transparent protective layer 11 formed by the above-mentioned S203 and the front surface 14 of the chip substrate 10 may be greater than the height between a first end 180 of the metal part 18 and the front surface 14 of the chip substrate 10, such that the transparent protective layer 11 may cover the photosensitive region 100 and the metal part 18.

In S204, an opening 110 may be formed at the position of the transparent protective layer 11 corresponding to the metal part 18, such that the first end 180 of the metal part 18 may be exposed from the opening 110.

For example, as shown in FIG. 3D, in an application case, the opening 110 may be formed on the transparent protective layer 11 by a laser cutting manner. Obviously, in other embodiments, the opening 110 may also be formed in other manners, which may not be limited according to various embodiments of the present application.

When the metal part 18 is the protruded metal point, since the height of the protruded metal point is relatively small, the protruded metal point may be damaged by laser cutting and the soldering pad 102 may be further damaged. Therefore, in one embodiment, before forming the opening 110 at the position of the transparent protective layer 11 corresponding to the metal part 18, the method provided in the present application may further include forming a metal protective layer, for example a copper layer and the like, on the side of the protruded metal point away from the soldering pad 102.

When the metal part 18 is the protruded metal column, since the height of the protruded metal column is relatively large, the laser cutting manner may not affect the soldering pad 102. Therefore, in one embodiment, there is no need to form a metal protection layer on the side of the protruded metal column away from the soldering pad 102, and the laser cutting may be directly performed to form the opening.

In S205, a cutting process may be performed along the dicing grooves 12 of the wafer, thereby removing a portion of the wafer 1 and a portion of the transparent protective layer 11 that correspond to the dicing grooves 12 to provide a plurality of single chips.

For example, in an application case, as shown in FIG. 3E, the wafer 1 and the transparent protective layer 11 corresponding to the dicing grooves 12 may be cut by a cutting manner, such as plasma, to obtain the single chips.

In S102, a conductive connection part may be used to electrically connect the first end of the metal part to a circuit board, such that the chip may be electrically connected to the circuit board.

For example, in an application case, in order to avoid loosening or relative position change between the chip and the circuit board during the connecting process of the conductive connection part, before the above-mentioned S102, the packaging method provided in the present application may further include fixing the back surface of the chip substrate with the circuit board. In one embodiment, the above-mentioned method for fixing the back surface of the chip substrate with the circuit board may include fixing the back surface of the chip substrate with the circuit board with an adhesive film. The adhesive film may be an adhesive object such as a double-sided adhesive. In other embodiments, other fixing manners may also be used, which may not be limited according to various embodiments of the present disclosure.

Figure 5A:
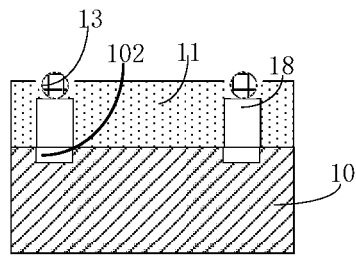
FIGS. 5A-5B illustrate structural schematics of an exemplary package device corresponding to S301-S302 in FIG. 4 according to various embodiments of the present disclosure.
Figure 5B:
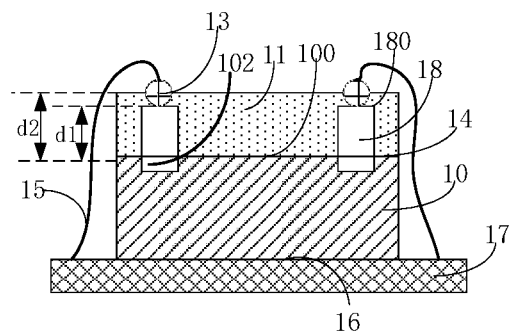

In one embodiment, referring to FIGS. 4, 5A, and 5B, FIG. 4 illustrates a schematic flowchart of performing S102 in FIG. 1 according to various embodiments of the present disclosure; and FIGS. 5A-5B illustrate structural schematics of an exemplary package device corresponding to S301-S302 in FIG. 4 according to various embodiments of the present disclosure. In order to make the connection between the conductive connection part and the metal part more convenient, in one embodiment, the above-mentioned S102 may, for example, include the following exemplary steps.

In S301, a solder ball 13 may be formed in the opening (not labeled in FIG. 5A), and the solder ball 13 may protrude from the transparent protective layer 11.

For example, as shown in FIG. 5A, in one embodiment, a solder ball mounting machine may be used to mount the solder ball 13. In addition, the above-mentioned S301 may also be performed before the above-mentioned S205, that is, the solder ball 13 may be mounted first, and then the cutting process may be performed on the dicing grooves 12 of the wafer 1.

In S302, the conductive connection part 15 may be used to electrically connect the solder ball 13 to the circuit board 17, such that the chip substrate 10 and the circuit board 17 may be electrically connected with each other.

For example, as shown in FIG. 5B, the conductive connection part 13 may be a wire in one embodiment. One end of the wire may be electrically connected to the solder ball 13, and the other end of the wire may be electrically connected to a preset position of the circuit board 17; and the electrical connection manner may include reflow soldering or the like. The chip may transmit signals to the circuit board 17 through the wire, or the chip may receive signals transmitted by the circuit board 17 through the wire. The material of the wire may be any one or a combination of gold, aluminum, copper, copper-iron, copper-nickel-silicon, copper-chromium, and copper-nickel-tin alloys, as long as the wire has conductive function, desirable mechanical strength, and anti-stress relaxation property. In one embodiment of the present disclosure, when the conductive connection part 15 is a wire, the solder ball 13 may not be provided in the opening 110, and the wire may be directly connected to the first end 180 of the metal part 18.

For example, one end of the wire may be electrically connected to the first end 180 of the metal part 18, and the other end of the wire may be electrically connected to a preset position of the circuit board 17. The electrical connection manner may include reflow-soldering manner or the like. The chip may transmit signals to the circuit board 17 through the wire, or the chip may receive signals transmitted by the circuit board 17 through the wire. The material of the wire may be any one or a combination of gold, aluminum, copper, copper-iron, copper-nickel-silicon, copper-chromium, and copper-nickel-tin alloys, as long as the wire has conductive function, desirable mechanical strength, and anti-stress relaxation property.

In another embodiment, compared with FIG. 5B, the height d1 between the first end 180 of the metal part 18 and the front surface 14 of the chip substrate 10 may be greater than the height d2 between the transparent protective layer 11 and the front surface 14 of the chip substrate 10; and the metal part may be a protruded metal column.

In still another embodiment, compared with FIG. 5B, the height d1 between the first end 180 of the metal part 18 and the front surface 14 of the chip substrate 10 may be equal to the height d2 between the transparent protective layer 11 and the front surface 14 of the chip substrate 10; and the transparent protective layer 11 may not cover the first end 180 of the metal part 18. In such way, the first end 180 of the metal part 18 may be exposed from the transparent protective layer 11, and the metal part 18 may be a protruded metal column or a protruded metal point. In an application case, in order to achieve that the height d1 between the first end 180 of the metal part 18 and the front surface 14 of the chip substrate 10 is equal to the height d2 between the transparent protective layer 11 and the front surface 14 of the chip substrate 10, the transparent protective layer 11 may cover the metal part 18 first, and the manner of polishing the transparent protective layer 11 may be used to achieve that the height d1 between the first end 180 of the metal part 18 and the front surface 14 of the chip substrate 10 may be equal to the height d2 between the transparent protective layer 11 and the front surface 14 of the chip substrate 10.

Figure 6:
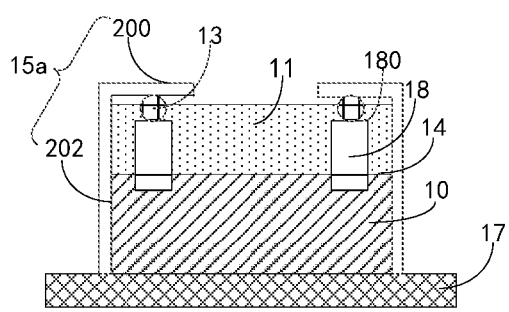
FIG. 6 illustrates a structural schematic of an exemplary package device according to various embodiments of the present disclosure.

In another application case, referring to FIG. 6, FIG. 6 illustrates a structural schematic of another exemplary package device according to various embodiments of the present disclosure. A conductive connection part 15a may be a conductive folded plate. The folded plate may include a first portion 200 and a second portion 202; one end of the first portion 200 may be connected to one end of the second portion 202; the first portion 200 may be in parallel with the front surface 14 of the chip substrate 10, and the first portion 200 may extend along a direction toward the chip substrate 10; and the second portion 202 may be in parallel with the sidewall of the chip, and the second portion 202 may be disposed in a close proximity to the sidewall of the chip.

In another embodiment, compared with FIG. 6, the height d1 between the first end 180 of the metal part 18 and the front surface 14 of the chip substrate 10 may be greater than the height d2 between the transparent protective layer 11 and the front surface 14 of the chip substrate 10.

In another embodiment, compared with FIG. 6, the height d1 between the first end 180 of the metal part 18 and the front surface 14 of the chip substrate 10 may be equal to the height d2 between the transparent protective layer 11 and the front surface 14 of the chip substrate 10; and the transparent protective layer 11 may not cover the first end 180 of the metal part 18. In such way, the first end 180 of the metal part 18 may be exposed from the transparent protective layer 11, and the metal part 18 may be a protruded metal column or a protruded metal point.

Figure 7:
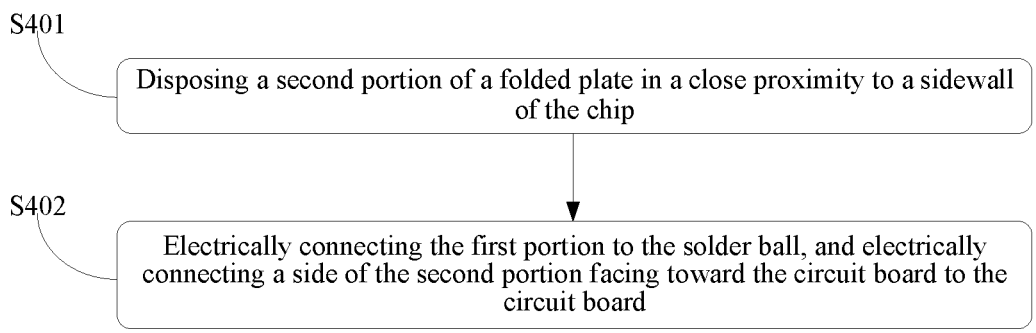
FIG. 7 illustrates a schematic flowchart of performing S302 in FIG. 4 according to various embodiments of the present disclosure.

Referring to FIG. 7, FIG. 7 illustrates a schematic flowchart of performing S302 in FIG. 4 according to various embodiments of the present disclosure. The above-mentioned S302 may, for example, include:

S401, disposing the second portion 202 of the folded plate in a close proximity to the sidewall of the chip; and S402, electrically connecting the first portion 200 to the solder ball 13, and electrically connecting the side of the second portion 202 facing toward the circuit board 17 to the circuit board 17. For example, in one embodiment, a layer of solder may be first coated on the side of the first portion 200 facing toward the chip substrate 10; and a layer of solder may be coated on the side of the second portion 202 which is in contact with the circuit board 17 (or the position where the circuit board 17 is in contact with the second portion 202). Obviously, a solder mounting manner may be also applied to the position where the circuit board 17 is in contact with the second portion 202.

Figure 8:
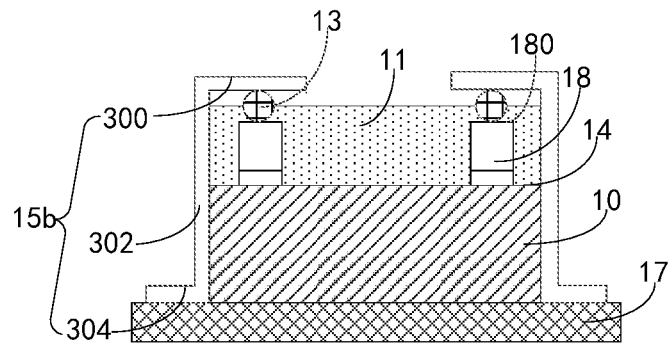
FIG. 8 illustrates a structural schematic of another exemplary package device according to various embodiments of the present disclosure.

In another application case, referring to FIG. 8, FIG. 8 illustrates a structural schematic of another exemplary package device according to various embodiments of the present disclosure. In the semiconductor package device provided in the present application, a conductive connection part 13b may be a conductive folded plate. In one embodiment, the folded plate may include a first portion 300, a second portion 302, and a third portion 304. Two ends of the second portion 302 may be respectively connected to the first portion 300 and the third portion 304; the first portion 300 may be in parallel with the front surface 14 of the chip substrate 10, and extend along a direction toward the chip substrate 10. The second portion 302 may be in parallel with the sidewall of the chip and disposed in a close proximity to the sidewall of the chip. The third portion 304 may extend away from the chip; the third portion 304 may be in parallel with the surface of the circuit board 17; the first portion 300 may be electrically connected to the first end 180 of the metal part 18; and the side of the third portion 304 facing toward the circuit board 17 may be electrically connected to the circuit board 17.

In another embodiment, compared with FIG. 8, the height d1 between the first end 180 of the metal part 18 and the front surface 14 of the chip substrate 10 may be greater than the height d2 between the transparent protective layer 11 and the front surface 14 of the chip substrate 10.

In still another embodiment, compared with FIG. 8, the height d1 between the first end 180 of the metal part 18 and the front surface 14 of the chip substrate 10 may be equal to the height d2 between the transparent protective layer 11 and the front surface 14 of the chip substrate 10; and the transparent protective layer may not cover the first end of the metal part. In such way, the first end of the metal part may be exposed from the transparent protective layer, and the metal part may be a protruded metal column or a protruded metal point.

Figure 9:
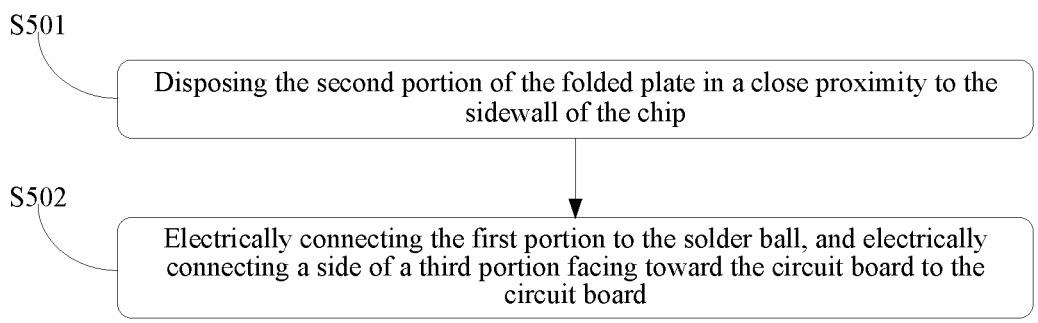
FIG. 9 illustrates another schematic flowchart of performing S302 in FIG. 4 according to various embodiments of the present disclosure.

Referring to FIG. 9, FIG. 9 illustrates another schematic flowchart of performing S302 in FIG. 1 according to various embodiments of the present disclosure. The above-mentioned S302 may, for example, include:

S501, disposing the second portion 302 of the folded plate in a close proximity to the sidewall of the chip; and S502, electrically connecting the first portion 300 to the solder ball 13, and electrically connecting the side of the third portion 304 facing toward the circuit board 17 to the circuit board 17. For example, in one embodiment, a layer of solder may be first coated on the side of the third portion 304 facing toward the chip substrate 10, and/or a layer of solder may be coated on the side of the third portion 304 which is in contact with the circuit board 17, or the position where the circuit board 17 is in contact with the third portion 304. Obviously, a solder mounting manner may be also applied to the position where the circuit board 17 is in contact with the third portion 304.

In the present application, the above-mentioned folded plate may be made of an all-metal material, for example, FPC (flexible circuit board) and the like; or the folded plate may include a metal material and an insulation material surrounding the metal material. The metal material may be equivalent to metal wires, and the surrounding insulation material may be equivalent to a frame structure.

The semiconductor package device prepared by the above-mentioned semiconductor package method may be further described hereinafter.

Referring to FIG. 5, the semiconductor package device may include: the chip substrate 10, where the chip substrate 10 may include the front surface 14 and the back surface 16; the front surface 14 of the chip substrate 10 may include the photosensitive region 100 and be disposed with the soldering pads 102 surrounding the photosensitive region 100. For example, the chip may be obtained by cutting the wafer. The quantity of soldering pads 102 may be multiple, for example 2, 4, and the like. In one embodiment, the soldering pads 102 may be equivalent to be embedded into the front surface 14 of the chip substrate 10.

The semiconductor package device may further include the metal part 18 formed on the side of the soldering pad 102 facing away from the chip 10. For example, in an application case, the metal part 18 may be a protruded metal point or a protruded metal column. When the metal part 18 is the protruded metal point, the metal part 18 may be formed by a bonding process, and the material of the protruded metal point may be gold and the like. When the metal part 18 is the protruded metal column, the metal part 18 may be formed by an electroplating process. The electroplating process may include partial electroplating, composite electroplating, pulse electroplating, electroforming, mechanical plating, and the like. The protruded metal column may be made of a conductive metal material including nickel, chromium, copper, zinc, cadmium, alloy, and/or any other suitable material(s), which may not be limited according to various embodiments of the present application.

The semiconductor package device may further include the transparent protective layer 11 which is at the front surface 14 of the chip substrate 10 and covers the photosensitive region 100 of the chip substrate 10. An opening may be formed at a position of the transparent protective layer 11 corresponding to the metal part 18, and the first end 180 of the metal part 18 away from the chip substrate 10 may be exposed from the transparent protective layer 11. That is, in one embodiment, the height d1 between the first end 180 of the metal part 18 and the front surface 14 of the chip substrate 10 may be less than the height d2 between the transparent protective layer 11 and the front surface 14 of the chip substrate 10. For example, in an application case, the transparent protective layer 11 may be formed by spin coating, dispensing or printing manners. The thickness of the transparent protective layer 11 formed by the above-mentioned manners may be in the micron level. Compared with the conventional manner of disposing transparent glass, the thickness of the transparent protective layer 11 may be less than the thickness of the transparent glass, and the light refraction, reflection, and energy loss may be reduced, thereby improving the photosensitive effect of the chip. The material of the transparent protective layer 11 may be an inorganic transparent material such as silicon nitride, silicon oxynitride and the like, or an organic transparent material such as polysiloxane. Furthermore, the manner for solidifying the transparent protective layer 11 may be ultraviolet irradiation or high-temperature baking. The used manner may be determined according to an initiator added to prepare the transparent protective layer 11. If the initiator is a photo-initiator (e.g., 2-hydroxy-2-methyl-1-phenylacetone, 1-hydroxycyclohexylphenyl ketone and the like), an ultraviolet radiation manner may be used; and if the initiator is a thermal initiator (e.g., benzoyl peroxide and the like), a high-temperature baking manner may be used.

The semiconductor package device may further include the circuit board 17 located on the back surface 16 of the chip substrate 10.

The semiconductor package device may further include the conductive connection part 15 which may electrically connect the surface of the first end 180 of the metal part 18, exposed by protruding over the surface of the transparent protective layer 11, to the circuit board 17, where the chip substrate 10 and the circuit board 17 may be electrically connected with each other.

In exemplary embodiment one as shown in FIG. 5B, the conductive connection part 15 may be a wire; and one end of the wire may be electrically connected to the solder ball 13, and the other end of the wire may be electrically connected to a preset position of the circuit board 17. One end of the wire may be electrically connected to the first end 180 of the metal part 18, and also be electrically connected to the first end 180 of the metal part 18 through the solder ball 13 in the transparent protective layer 11. The material of the wire may be any one or a combination of gold, aluminum, copper, copper-iron, copper-nickel-silicon, copper-chromium, and copper-nickel-tin alloys, as long as the wire has conductive function, desirable mechanical strength, and anti-stress relaxation property.

In one embodiment, in order to reduce the shaking probability between the chip substrate 10 and the circuit board 17, the package device provided in one embodiment may further include an adhesive film (not shown in FIGS. 5A-5B) located between the back surface 16 of the chip substrate 10 and the circuit board 17.

In exemplary embodiment two as shown in FIG. 6, the difference between exemplary embodiment two shown in FIG. 6 and exemplary embodiment one shown in FIG. 5B is: the conductive connection part 15a may be the conductive folded plate; the folded plate may include the first portion 200 and the second portion 202; the first portion 200 may be in parallel with the front surface 14 of the chip substrate 10 and extend along the direction toward the chip substrate 10; the second portion 202 may be in parallel with the sidewall of the chip and disposed in a close proximity to the sidewall of the chip; the first portion 200 may be electrically connected to the first end 180 of the metal part 18; and the side of the second portion 202 facing toward the circuit board 17 may be electrically connected to the circuit board 17. In one embodiment, the folded plate may be made of an all-metal material; or the folded plate may include a metal material and an insulation material surrounding the metal material. The metal material may be equivalent to metal wires, and the surrounding insulation material may be equivalent to a frame structure.

In exemplary embodiment three as shown in FIG. 8, the difference between exemplary embodiment three and exemplary embodiment one shown in FIG. 5B is: the conductive connection part 15b may be a conductive folded plate; the folded plate may include the first portion 300, the second portion 302, and the third portion 304, where the first portion 300 may be connected to the third portion 304 through the second portion 302; the first portion 300 may be in parallel with the front surface 14 of the chip substrate 10 and extend along the direction toward the chip 10; the second portion 302 may be in parallel with the sidewall of the chip and disposed in a close proximity to the sidewall of the chip; the third portion 304 may extend away from the chip 10; the third portion 304 may be in parallel with the surface of the circuit board 17; the first portion 300 may be electrically connected to the first end 180 of the metal part 18; and the side of the third portion 304 facing toward the circuit board 17 may be electrically connected to the circuit board 17. In one embodiment, the folded plate may be made of an all-metal material; or the folded plate may include a metal material and an insulation material surrounding the metal material.

Compared with the conventional technology, the technical solutions of various embodiments provided by the present disclosure may have the following beneficial effects.

Different from the existing technology, in the packaging method provided by the present application, the transparent protective layer may be directly formed on the front surface of the chip substrate. On the one hand, the method may be used to control the thickness of the transparent protective layer; compared with the conventional manner of disposing transparent glass, the thickness of the transparent protective layer may be less than the thickness of transparent glass, which may reduce light refraction, reflection and energy loss, and improve the photosensitive effect of the chip. On the other hand, since the transparent protective layer is directly formed on the front of the chip substrate, the probability of the transparent protective layer being separated from the front surface of the chip substrate may be low, and the dust-free requirement of the usage environment may be further reduced.

Various embodiments of the present application may be described above, which may not limit the patent scope of the present application. Any equivalent structure or equivalent process transformation made using the contents of the description and drawings of the present application or directly or indirectly applied to other related technical fields may be included in the patent protection scope of the present application.

What is claimed is:
1. A semiconductor packaging method, comprising:
providing a chip, wherein the chip includes:
a chip substrate having a front surface and a back surface, wherein the front surface includes a photosensitive region;
soldering pads disposed at the front surface of the chip substrate surrounding the photosensitive region;
a metal part formed on a side of each soldering pad facing away from the chip substrate; and
a transparent protective layer formed on the front surface of the chip substrate, wherein the transparent protective layer covers the photosensitive region of the chip substrate the transparent protective layer encapsulates an entire sidewall of the metal part, and the transparent protective layer contains an opening at a position corresponding to the metal part to expose a first end of the metal part away from the soldering pads; and
electrically connecting the first end of the metal part to a circuit board using a conductive connection part to electrically connect the chip with the circuit board, the conductive connection part including:
a first portion electrically connecting to the first end of the metal part, the sidewall of the chip substrate being coplanar with the sidewall of the transparent protective layer, and
a second portion in parallel with the coplanar sidewalls of the chip substrate and the transparent protective layer.

2. The method according to claim 1, wherein providing the chip includes:
providing a wafer, wherein the wafer includes a plurality of chip substrates arranged in a matrix and separated by dicing grooves between adjacent chip substrates, and the soldering pads are formed at the front surface of each chip substrate and surrounding a corresponding photosensitive region of each chip substrate;
forming the metal part on each soldering pad facing away from the chip substrate;
forming the transparent protective layer on the front surface of the chip substrate, wherein the transparent protective layer covers the photosensitive region and the metal part;
forming the opening in the transparent protective layer at the position corresponding to the metal part, such that the first end of the metal part away from the soldering pads is exposed by the opening; and
performing a cutting process along the dicing grooves of the wafer, thereby removing a portion of the wafer and a portion of the transparent protective layer that correspond to the dicing grooves to provide a plurality of single chips.

3. The method according to claim 2, wherein forming the transparent protective layer on the front surface of the chip substrate includes:
forming the transparent protective layer on the front surface of the chip substrate by spin coating, dispensing or printing a material, and solidifying the material for the transparent protective layer.

4. The method according to claim 3, wherein solidifying the material for the transparent protective layer includes:
solidifying the material for the transparent protective layer using ultraviolet irradiation or high-temperature baking.

5. The method according to claim 3, wherein:
the transparent protective layer is made of the material including an inorganic transparent material and/or an organic transparent material, wherein the inorganic transparent material includes at least one of silicon nitride and silicon oxynitride; and the organic transparent material includes polysiloxane.

6. The method according to claim 2, wherein electrically connecting the first end of the metal part to the circuit board using the conductive connection part to electrically connect the chip with the circuit board includes:
forming a solder ball in the opening; and
using the conductive connection part to electrically connect the solder ball to the circuit board, such that the chip substrate and the circuit board are electrically connected with each other.

7. The method according to claim 1, wherein electrically connecting the first end of the metal part to the circuit board using the conductive connection part includes:
using a wire to electrically connect the first end of the metal part to the circuit board.

8. The method according to claim 1, wherein electrically connecting the first end of the metal part to the circuit board using the conductive connection part includes:
using a conductive folded plate to electrically connect the first end of the metal part to the circuit board.

9. The method according to claim 8, wherein:
the first portion is in parallel with the front surface of the chip substrate; the second portion is in contact with the sidewall of the chip substrate and a side of the second portion facing toward the circuit board is electrically connected to the circuit board.

10. The method according to claim 8, wherein:
the conductive folded plate includes the first portion, the second portion, and a third portion, wherein the first portion is connected to the third portion through the second portion; the first portion is in parallel with the front surface of the chip substrate; the second portion is in contact with the sidewall of the chip substrate; the third portion extends along a direction away from the chip; the third portion is in parallel with a surface of the circuit board; and a side of the third portion facing toward the circuit board is electrically connected to the circuit board.

11. A semiconductor package device, comprising:
a chip, wherein the chip includes: a chip substrate having a front surface and a back surface, wherein the front surface includes a photosensitive region;
soldering pads disposed at the front surface of the chip substrate surrounding the photosensitive region;
a metal part formed on a side of each soldering pad facing away from the chip substrate; and
a transparent protective layer formed on the front surface of the chip substrate, wherein the transparent protective layer covers the photosensitive region of the chip substrate the transparent protective layer encapsulates an entire sidewall of the metal part; and the transparent protective layer contains an opening at a corresponding to the metal part to expose a first end of the metal part away from the soldering pads;
a circuit board, on the back surface of the chip substrate; and
a conductive connection part electrically connecting the chip with the circuit board, and including:
a first portion, which electrically connects to a surface of the first end of the metal part, the sidewall of the chip substrate being coplanar with the sidewall of the transparent protective layer, and
a second portion in parallel with the coplanar sidewalls of the chip substrate and the transparent protective layer.

12. The device according to claim 11, wherein:
the transparent protective layer is formed by spin coating, dispensing, or printing a material.

13. The device according to claim 12, wherein:
the transparent protective layer is a material after solidifying the material for the transparent protective layer using ultraviolet irradiation or high-temperature baking.

14. The device according to claim 11, wherein:
the conductive connection part is a wire; and the metal part is a protruded metal column, or a protruded metal point.

15. The device according to claim 11, wherein:
the conductive connection part is a conductive folded plate, wherein the first portion is in parallel with the front surface of the chip substrate; the second portion is in contact with the sidewall of the chip substrate and a side of the second portion facing toward the circuit board is electrically connected to the circuit board.

16. The device according to claim 11, wherein:

the conductive connection part is a conductive folded plate, and the conductive folded plate includes the first portion, the second portion, and a third portion, wherein the first portion is connected to the third portion through the second portion; the first portion is in parallel with the front surface of the chip substrate; the second portion is in contact with the sidewall of the chip substrate the third portion extends along a direction away from the chip; the third portion is in parallel with a surface of the circuit board; and a side of the third portion facing toward the circuit board is electrically connected to the circuit board.

17. The device according to claim 15, wherein:

the conductive folded plate is made of an all-metal material; or the conductive folded plate includes a metal material and an insulation material surrounding the metal material.

18. The device according to claim 16, wherein:

the conductive folded plate is made of an all-metal material; or the conductive folded plate includes a metal material and an insulation material surrounding the metal material.

19. The device according to claim 11, further including:

a solder ball, wherein the solder ball is at the surface of the first end of the metal part, exposed by protruding over the surface of the transparent protective layer; and the solder ball is electrically connected to the conductive connection part.

20. The device according to claim 11, further including:

an adhesive film, between the back surface of the chip substrate and the circuit board.

\* \* \* \* \*